(12) United States Patent
Bartley et al.

(10) Patent No.: US 9,680,477 B2
(45) Date of Patent: Jun. 13, 2017

(54) PRINTED CIRCUIT BOARD SECURITY USING EMBEDDED PHOTODETECTOR CIRCUIT

(71) Applicant: International Business Machines Corporation, Armonk, NY (US)

(72) Inventors: Gerald K. Bartley, Rochester, MN (US); Darryl J. Becker, Rochester, MN (US); Matthew S. Doyle, Rochester, MN (US); Mark O. Maxson, Mantorville, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 163 days.

(21) Appl. No.: 14/574,510

(22) Filed: Dec. 18, 2014

(65) Prior Publication Data
US 2016/0173105 A1 Jun. 16, 2016

Related U.S. Application Data

(63) Continuation of application No. 14/570,150, filed on Dec. 15, 2014.

(51) Int. Cl.
| | |
|---|---|
| H03K 19/00 | (2006.01) |
| G08B 29/00 | (2006.01) |
| H03K 19/177 | (2006.01) |
| H05K 3/30 | (2006.01) |
| H05K 1/02 | (2006.01) |

(52) U.S. Cl.
CPC ..... *H03K 19/17768* (2013.01); *H05K 1/0275* (2013.01); *H05K 3/30* (2013.01); *H05K 2201/10151* (2013.01)

(58) Field of Classification Search
CPC .......................... H03K 19/17768; H05K 3/30
USPC .................... 326/8; 726/33, 34, 35; 713/194
See application file for complete search history.

(56) References Cited

U.S. PATENT DOCUMENTS

| | | |
|---|---|---|
| 6,686,539 B2 | 2/2004 | Farquhar et al. |
| 6,946,960 B2 | 9/2005 | Sisson et al. |
| 7,005,733 B2 | 2/2006 | Kommerling et al. |
| 7,472,836 B2 | 1/2009 | Farooq et al. |
| 7,475,474 B2 | 1/2009 | Heitmann et al. |
| 7,599,192 B2 | 10/2009 | Pennaz et al. |
| 7,703,201 B2 | 4/2010 | Oggioni et al. |
| 2005/0005156 A1 | 1/2005 | Harper |
| 2013/0141137 A1* | 6/2013 | Krutzik ................ H03K 19/173 326/8 |

(Continued)

OTHER PUBLICATIONS

Peters et al. "Protection of Data Carriers using Secure Optical Codes." Proceedings of SPIE-IS&T Electronic Imaging, SPIE vol. 6075, 2006, 11 pages.

(Continued)

*Primary Examiner* — Daniel D Chang
(74) *Attorney, Agent, or Firm* — Patterson + Sheridan, LLP

(57) ABSTRACT

Systems and methods to obstruct analysis of a microchip may include an electrical component of a microchip and a photodetector positioned within the microchip. The photodetector may be configured to sense electromagnetic radiation. Circuitry in electrical communication with the photodetector may be configured to initiate an action to obstruct analysis of the electrical component in response to a change in a level of the electromagnetic radiation.

20 Claims, 4 Drawing Sheets

(56) References Cited

U.S. PATENT DOCUMENTS

2013/0232587 A1 9/2013 Boday et al.
2014/0108786 A1 4/2014 Kreft

OTHER PUBLICATIONS

"List of IBM Patents or Patent Applications Treated as Related", Dec. 17, 2014, 1 page.

* cited by examiner

PRINTED CIRCUIT BOARD SECURITY USING EMBEDDED PHOTODETECTOR CIRCUIT

I. CROSS REFERENCE TO RELATED APPLICATIONS

This application is a continuation application and claims priority from U.S. patent application Ser. No. 14/570,150, entitled "PRINTED CIRCUIT BOARD SECURITY USING EMBEDDED PHOTODETECTOR CIRCUIT," filed on Dec. 15, 2014, which is incorporated herein in its entirety.

II. FIELD OF THE DISCLOSURE

The present disclosure relates generally to microchip technologies, and more particularly, to protecting the circuitry and content of microchips.

III. BACKGROUND

Protecting microchip technology deployed in the field is an enormous concern in both military and commercial sectors. Microchips and related devices are routinely acquired by motivated competitors and governments seeking to reverse engineer or otherwise learn the functionality of the technology. Such information is used to make a technological leap in their own devices, or may be used to exploit a perceived weakness in the examined equipment. Sophisticated government and commercial entities thus possess ample strategic and economic motivation to reverse engineer microchip components.

A microchip, or integrated circuit, is a unit of packaged computer circuitry that is manufactured from a material, such as silicon, at a very small scale. Microchips are made for program logic (logic or microprocessors) and for computer memory (Random Access Memory or other memory microchips). Microchips are also made that include both logic and memory, and for special purposes, such as analog-to-digital conversion, bit slicing and gateways.

An advanced method of reverse engineering select microchip components uses high energy photons, electrons or ions. Focused ion beam processes excite active portions of a microchip to observe how other portions are affected. When used to reverse engineer, these processes are typically done while the microchip is in a powered-on state in order to observe the functionality of the microchip.

Microchip designers in the aerospace, defense and commercial industries routinely implement software and other logic-related techniques to confuse and thwart attempts to probe the active side of the component. For example, safeguard measures integrated within microchips hinder reverse engineering techniques. Microchip designers capitalize on the powered on status required by a reverse engineering process to incorporate a self-destruct or obstructing mechanism into the microchip. The mechanism is triggered by the detection of tampering. When tampering is detected, the power in the circuit is diverted to microchip annihilation or another predetermined measure.

Microchip designers sometimes impede the reverse engineering processes by plating the back of the bulk silicon with a metal layer. While intact, this layer obstructs both the insertion of ions and electrons, and the observation of photons. Using multiple assembly processes, mesh sensors may be placed around security sensitive circuitry.

While these safeguards provide some protection, motivated exploiters have developed ingenious ways of analyzing the microchip without triggering the safeguard mechanisms. Despite the precautions, the backside of the microchip remains vulnerable to inspection by photons, focused ion beam, or even simple infrared observation. Sophisticated exploitation techniques overcome conventional obstacles by removing the bulk silicon and metallized back layer. For instance, reverse engineering processes may grind away the metallized portion towards implementing a successful focused ion beam operation. In this manner, microchip information may be exploited in a manner that does not initialize a self-destruct feature.

IV. SUMMARY OF THE DISCLOSURE

According to an embodiment, an apparatus includes an electrical component of a microchip and a photodetector positioned within the microchip. The photodetector may be configured to sense electromagnetic radiation. Circuitry in electrical communication with the photodetector may be configured to initiate an action to obstruct analysis of the electrical component in response to a change in a level of the electromagnetic radiation.

According to another embodiment, a method of manufacturing a microchip includes positioning a photodetector within a microchip. The photodetector is configured to sense electromagnetic radiation. Circuitry may be positioned within the microchip to be in electrical communication with the photodetector. The circuitry may be further configured to initiate an action to obstruct analysis of an electrical component in response to a change in a level of the electromagnetic radiation.

According to another embodiment, a computer readable storage medium includes instructions that when executed by a processor cause the processor to receive a signal from a photodetector embedded within a microchip. The photodetector may be configured to sense electromagnetic radiation. In response to the signal, the program code may initiate an action to obstruct analysis of an electrical component in response to a change in a level of the electromagnetic radiation.

Embodiments of the system may safeguard security sensitive data and circuitry that could be otherwise compromised by reverse engineering and other exploitation efforts. A photodetector may continuously monitor light levels to thwart drilling efforts. A microchip and its stored data may be protected from undesired analysis by, in part, detecting an alteration of an alteration in the light level and initiating an action for obstructing analysis of the security sensitive circuitry. Optical sensors and associated logic may be added during the laminar process to reduce assembly procedures.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

V. BRIEF DESCRIPTION OF THE DRAWINGS

FIG. 1 generally illustrates a cross-section of an integrated circuit assembly that includes a photodetector configured to detect ambient light in order to verify the security and integrity of a microchip in accordance with the underlying principles of an embodiment;

VI. DETAILED DESCRIPTION

An embodiment includes an optical detection system buried within printed circuit board (PCB) laminate. The system may detect an attempt to tamper with a microchip by sensing light a change in a light level present at an internal microchip component. The light may emanate from an external ambient source or from an internally generated source. Sensors and associated logic may be added during the laminar process. This feature provides manufacturing advantages over conventional designs, such as those using mesh or sheet sensors, which require multiple assembly procedures.

An embodiment provides circuitry to defend against exploitation, and the circuitry may be embedded within a laminate manufacturing process. Lamination includes placing a stack of materials (e.g., etched, copper-clad laminate, prepreg, and foil), into a press and applying pressure and heat. Lamination may result in an inseparable, one piece product that may be drilled, plated, and etched again to get traces on top and bottom layers.

Tamper recognition components involving either internal or external visible light detection may be employed. Another embodiment may use both internal and external light detection. Detection of a drill bit may occur whenever light exits and/or enters the laminate structure. Such components may be useful for identifying an exploitation event, and in response, initiating a defensive action for obstructing the effort and protecting security sensitive circuitry.

Figure 1:
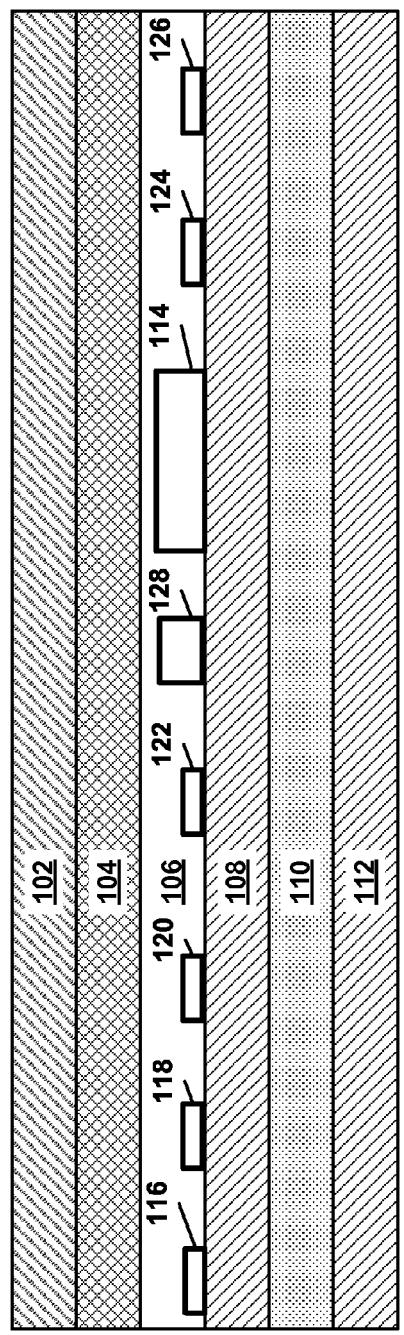

Turning more particularly to the drawings, FIG. 1 generally illustrates a cross-section of an integrated circuit assembly 100 that includes photodetectors 116, 118, 120, 122, 124, 126. The photodetectors 116, 118, 120, 122, 124, 126 may be configured to detect ambient light in order to verify the security and integrity of the integrated circuit assembly 100.

The integrated circuit assembly 100 may include multiple, laminated layers 102, 104, 106, 108, 110, 112. More particularly, a light containment layer 102 may be positioned proximate a layer 104 of optical light waveguide material. The waveguide material may direct light to the photodetectors 116, 118, 120, 122, 124, 126 that breaks through the light containment layer 102 as a result of a drilling procedure. The layer 106 may include a security sensitive component 114, in addition to the photodetectors 116, 118, 120, 122, 124, 126. The layers 108, 110, 112 may comprise multilayer PCB components.

The photodetector 116, 118, 120, 122, 124, 126 may comprise sensors configured to detect a level of light or other electromagnetic energy and to generate a corresponding signal. The signal may be received by logic 128 configured to determine a change in an expected light level. The logic 128 may further be configured to initiate a defensive action in response to the sensed light not being at the expected level. According to an embodiment, the logic 128 may store a first light level and may compare it to a second light level. A defensive action intended to impede reverse engineering efforts may be initialized when the light levels differ. The difference may exceed a predetermined threshold.

Figure 2:
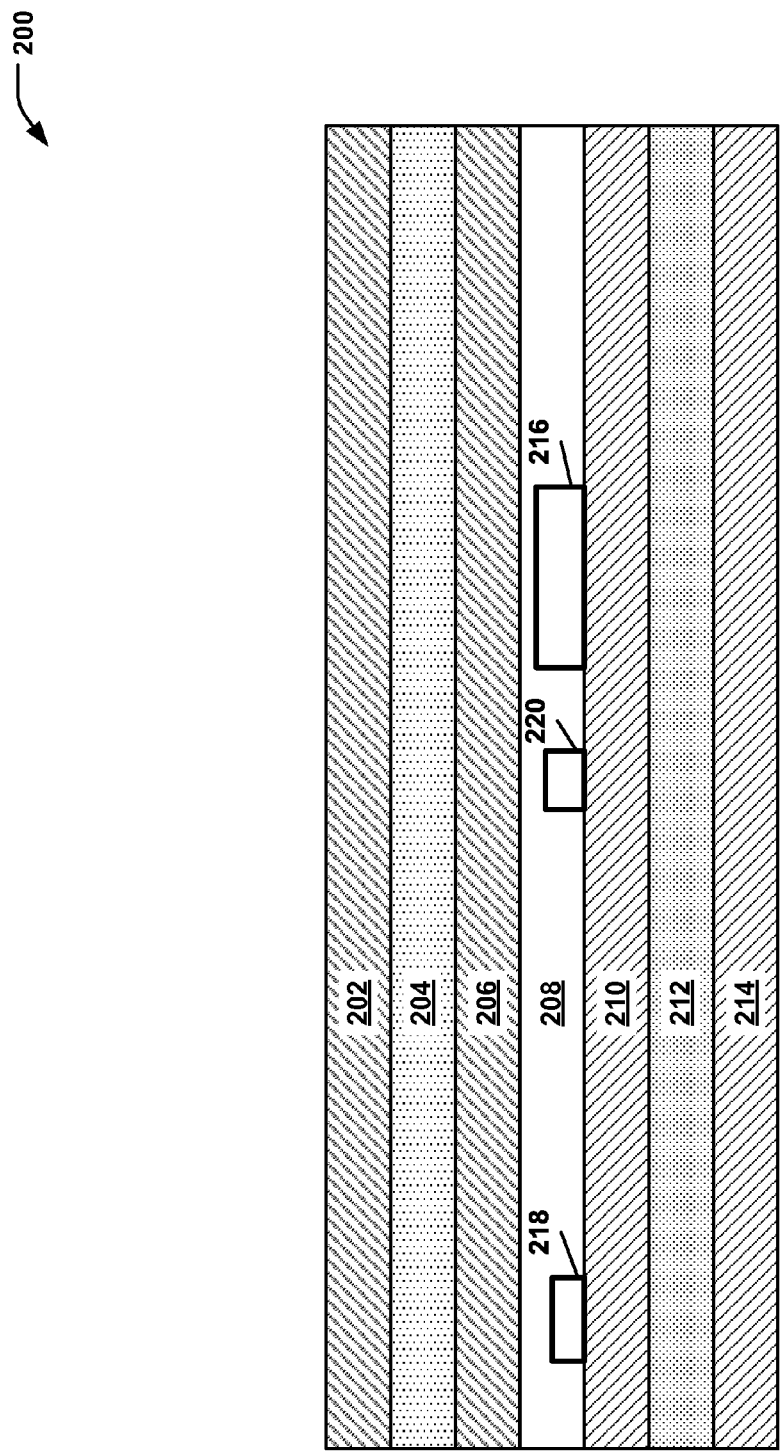
FIG. 2 shows a cross-section of another embodiment of an integrated circuit assembly that includes a light source and photodetector configured to detect a change in the light emanating from the source.

FIG. 2 illustrates a cross-section of another embodiment of an integrated circuit assembly 200 that includes low level light source 218 and photodetector 204 configured to detect a change in the light emanating from the source 218.

The photodetector 204 may comprise a sheet form of a photosensitive material. For example, a photocell layer may be sandwiched between light containment layers 202, 206. The photodetector 204 may be configured to detect any light from the light source 218 in order to verify the security and integrity of the integrated circuit assembly 200. As with the embodiment of the system 100 of FIG. 1, an illustrative photodetector may alternatively comprise one or more photoresistors, light meters (e.g., selenium meters), charge-coupled devices (CCDs), or devices configured to react to electromagnetic radiation by generating current in proportion to the electromagnetic radiation.

The layer 208 may include a security sensitive component 216, in addition to the light source 218 and tamper detection logic 220. The layers 210, 212, 214 may comprise multilayer PCB components. The layer 208 may include optically transparent laminate (e.g., glass, plastic, epoxy, liquid crystal polymer).

The photodetector 204 may generate a signal that is received by logic 220 configured to determine a change in an expected light level. The logic 220 may further be configured to initiate a defensive action in response to the sensed light not being at the expected level. For example, a defensive action to impede reverse engineering efforts may be initialized when light is incident on the photodetector 204.

Figure 3:
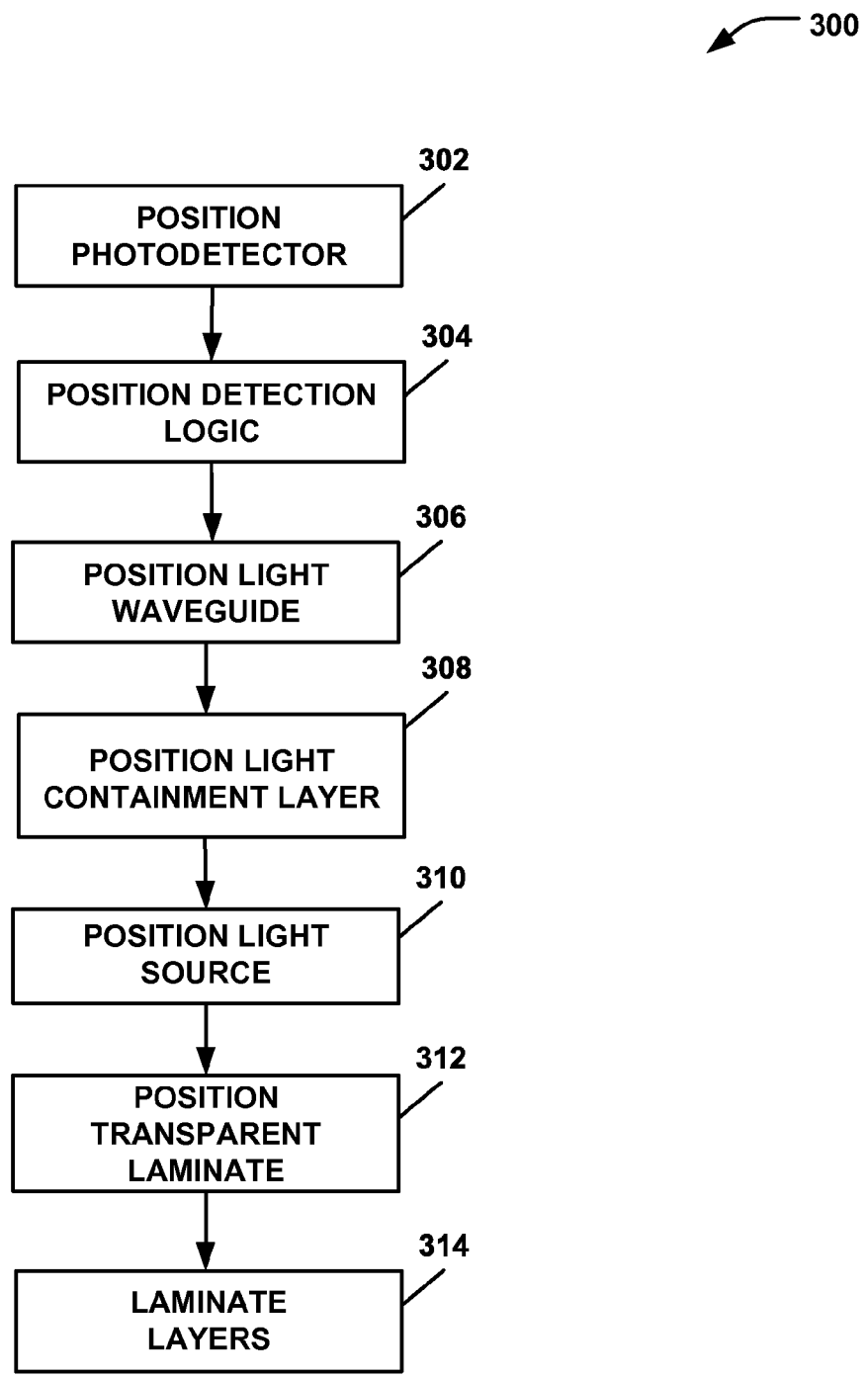
FIG. 3 is a flowchart of an embodiment of manufacturing a microchip having a photodetector to sense and thwart an exploitation effort.

The flowchart 300 of FIG. 3 is a flowchart of an embodiment of manufacturing a microchip having a photodetector to sense and thwart an exploitation effort. Examples of the microchip may include the integrated circuit assemblies 100, 200 of the embodiments shown in FIGS. 1 and 2.

At block 302 of FIG. 3, a photodetector may be positioned within a microchip design. For example, one or more photodetectors may be included proximate security sensitive circuitry to detect ambient light, as in FIG. 1. Alternatively or additionally, one or more photodetectors may be positioned in such a manner as to sense light emanating from an internal light source, as in FIG. 2.

Detection logic may be positioned at 304. The detection logic may be in communication with the photodetector. In response to receiving a signal from the photodetector, the detection logic, or program code, may be configured to initiate a defensive action or to allow normal operation of the microchip.

According to a particular embodiment, light waveguide material may be positioned at 306, as shown in FIG. 1. The light waveguide material may direct ambient light filtering through an outer microchip layer during a drilling operation to photodetectors.

At 308, light containment layers, such as layer 182 of FIG. 1 and layers 202 and 206 of FIG. 2 may be positioned. Where configured, the containment layer may sandwich photodetector material, as in FIG. 2. Such an embodiment may additionally include a light source positioned at 310. The light source, as shown in FIG. 2, may provide an internal source of radiant energy for use in detecting a tampering attempt.

A layer of transparent laminate may be positioned at 312 within the microchip design. The layer of transparent laminate, such as a resin or glass or plastic material, may hold one or more of the photodetectors, logic, security sensitive components, and light sources in place while allowing light to be communicated throughout the transparent (e.g., mostly transparent, semi-transparent, or non-opaque) layer.

The layers may be laminated at 314. As described herein, the lamination process may include placing a stack of layers into a press and applying pressure and heat. Lamination may result in an inseparable, one piece product that may be drilled, plated, and etched again to get traces on top and bottom layers. This feature provides manufacturing advantages over conventional designs that require multiple assembly procedures.

Figure 4:
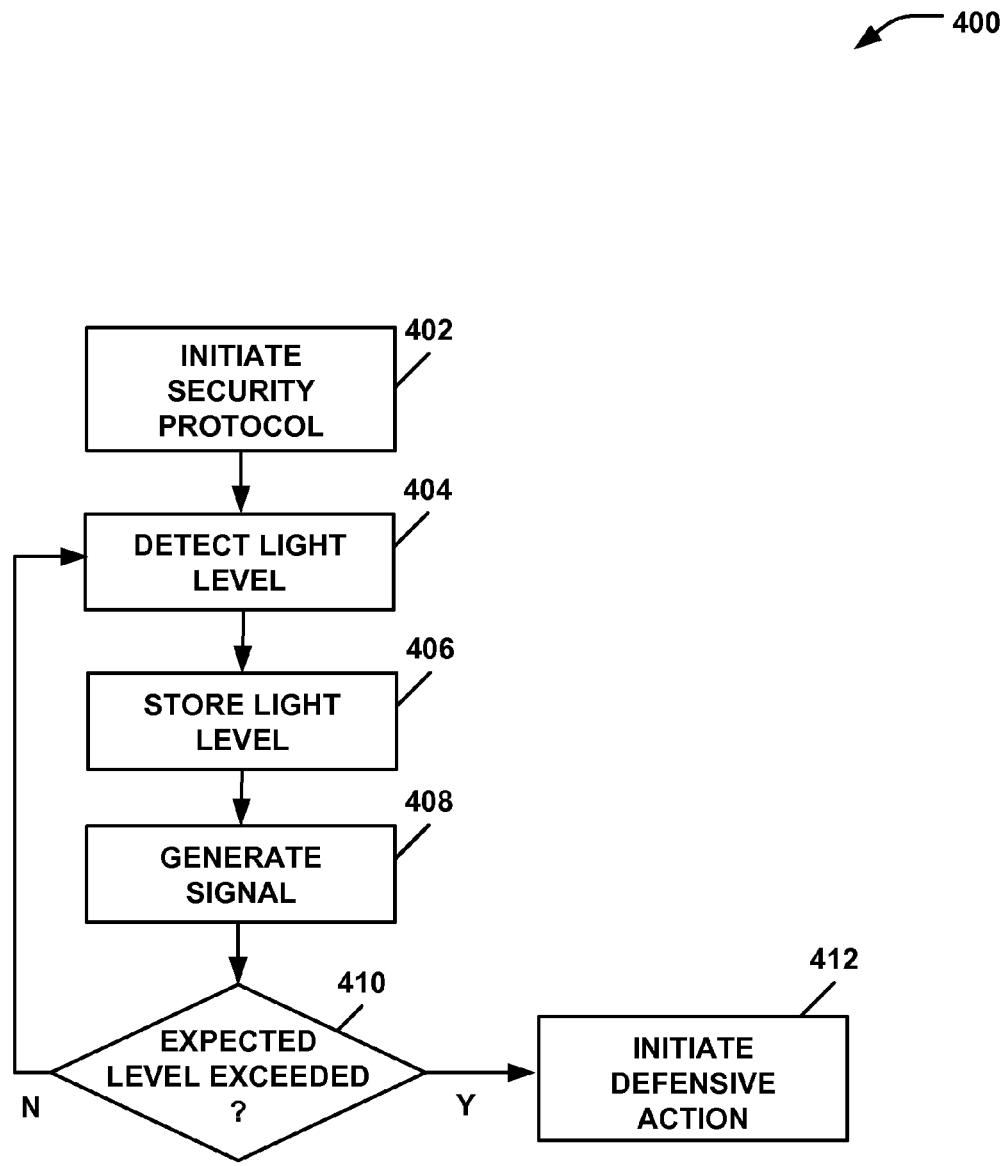
FIG. 4 is a flowchart of an embodiment of a method executable by the integrated circuit assembly of either FIG. 2 or FIG. 3 for detecting and obscuring a reverse engineering effort.

The flowchart 400 of FIG. 4 includes steps executable by the integrated circuit of either FIG. 1 or FIG. 2 to detect and impede a reverse engineering and data exploitation effort. At 402 of the flowchart, a security protocol may be initiated. Such a protocol may be initiated during startup, for example. The security protocol may include setting a light threshold level that may trigger a defensive action, should it be exceeded. In an embodiment, the light threshold level may be zero (i.e., no light detected). The light threshold level may have a built in tolerance range, where desired.

A light level may be detected at 404 by a photodetector, such as the photodetectors 116, 118, 120, 122, 124, 126 and 204 of FIGS. 1 and 2. The detected light may be from either or both ambient or internally powered sources. According to one embodiment, the photodetectors may store the detected light level at 406. Another embodiment, where the presence of any detected light triggers an alarm, may not store a baseline or previous detected light level.

The photodetector may generate at 408 a signal indicative of the detected light level. According to an embodiment, the signal may be continuously generated. A system of another embodiment may only generate a signal when an unexpected light level is detected.

When logic determines at 410 that an expected electromagnetic radiation level is exceeded, a defensive action designed to frustrate an exploitation attempt may be initiated at 412. Alternatively, light monitoring may continue back at 404 while operation of the microchip is uninterrupted.

Particular embodiments described herein may take the form of an entirely hardware embodiment, an entirely software embodiment or an embodiment containing both hardware and software elements. In a particular embodiment, the disclosed methods are implemented in software that is embedded in processor readable storage medium and executed by a processor, which includes but is not limited to firmware, resident software, microcode, etc.

Further, embodiments of the present disclosure, such as the one or more embodiments may take the form of a computer program product accessible from a computer-usable or computer-readable storage medium providing program code for use by or in connection with a computer or any instruction execution system. For the purposes of this description, a non-transitory computer-usable or computer-readable storage medium may be any apparatus that may tangibly embody a computer program and that may contain, store, communicate, propagate, or transport the program for use by or in connection with the instruction execution system, apparatus, or device.

In various embodiments, the medium may include an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and digital versatile disk (DVD).

A data processing system suitable for storing and/or executing program code may include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) may be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. An apparatus comprising:
   an electrical component of a microchip;
   a photodetector positioned within the microchip and configured to sense electromagnetic radiation comprising light radiated from one or more light sources;
   a first light source of the one or more light sources, the first light source positioned within the microchip; and
   circuitry in electrical communication with the photodetector and configured to initiate an action to obstruct analysis of the electrical component in response to a change in a level of the sensed electromagnetic radiation.

2. The apparatus of claim 1, wherein the electromagnetic radiation comprises ambient light emanating from a second light source of the one or more light sources and positioned outside of the microchip.

3. The apparatus of claim 1, wherein the photodetector comprises a layer of photosensitive material.

4. The apparatus of claim 1, further comprising a light containment layer positioned between the photodetector and the first light source.

5. The apparatus of claim 1, wherein the photodetector is sandwiched between first and second light containment layers.

6. The apparatus of claim 3, further comprising an optically transparent laminate layer proximate to the first light source.

7. The apparatus of claim 1, further comprising a layer of light waveguide material configured to guide the electromagnetic radiation to the photodetector.

8. The apparatus of claim 1, wherein the electromagnetic radiation comprises light emanating from the first light source.

9. The apparatus of claim 1, wherein the electromagnetic radiation comprises visible light.

10. The apparatus of claim 1, wherein the electromagnetic radiation comprises ambient light emanating from outside of the microchip and light generated from within the microchip.

11. The apparatus of claim 1, wherein the defensive action includes an operation selected from a group consisting of at least one of: a shutdown operation, a spoofing operation, and a self-destruct operation.

12. The apparatus of claim 1, wherein a change in a level of the sensed electromagnetic radiation comprises determining that a second light level of the sensed electromagnetic radiation is different than a stored first light level.

13. The apparatus of claim 12, wherein determining that a second light level of the sensed electromagnetic radiation is different than a stored first light level comprises determining that a difference between the second light level and the stored first light level exceeds a predetermined threshold.

14. An integrated circuit comprising:
   an electrical component disposed at a first layer;
   at least one photodetector configured to sense light radiated from one or more light sources;
   a second layer disposed between the at least one photodetector and a first light source, the second layer comprising a light containment material; and
   circuitry communicatively coupled with the at least one photodetector and configured to:
      identify, responsive to at least a predetermined change in the sensed light, that an exploitation event has occurred, and
      initiate, responsive to identifying that an exploitation event has occurred, a predefined action to obstruct analysis of the electrical component.

15. The integrated circuit of claim 14, wherein identifying that an exploitation event has occurred comprises determining, using the at least one photodetector, that light from the first light source has broken through the second layer.

16. The integrated circuit of claim 14, wherein the predefined action includes an operation selected from a group consisting of at least one of: a shutdown operation, a spoofing operation, and a self-destruct operation.

17. The integrated circuit of claim 14, further comprising:
   a third layer comprising the at least one photodetector.

18. The integrated circuit of claim 17, wherein the first layer comprises an optically transparent laminate material, and wherein the first light source is disposed at the first layer.

19. The integrated circuit of claim 18, further comprising:
   a fourth layer disposed between the third layer and a second light source, the fourth layer comprising a light containment material.

20. The integrated circuit of claim 19, wherein the second light source is external to the integrated circuit.

* * * * *